(12) United States Patent
Cooley

(10) Patent No.: US 11,071,194 B2
(45) Date of Patent: Jul. 20, 2021

(54) LONGITUDINALLY JOINED SUPERCONDUCTING RESONATING CAVITIES

(71) Applicant: Fermi Research Alliance, LLC, Batavia, IL (US)

(72) Inventor: Lance Cooley, Geneva, IL (US)

(73) Assignee: Fermi Research Alliance, LLC, Batavia, IL (US)

( * ) Notice: Subject to any disclaimer, the term of this patent is extended or adjusted under 35 U.S.C. 154(b) by 806 days.

(21) Appl. No.: 15/656,509

(22) Filed: Jul. 21, 2017

(65) Prior Publication Data

US 2018/0027644 A1  Jan. 25, 2018

Related U.S. Application Data

(60) Provisional application No. 62/364,975, filed on Jul. 21, 2016.

(51) Int. Cl.
| | |
|---|---|
| *H05H 7/20* | (2006.01) |
| *H01L 39/14* | (2006.01) |
| *H01L 39/24* | (2006.01) |
| *H01P 11/00* | (2006.01) |
| *H01P 7/06* | (2006.01) |

(52) U.S. Cl.
CPC ............... *H05H 7/20* (2013.01); *H01L 39/14* (2013.01); *H01L 39/141* (2013.01); *H01L 39/2406* (2013.01); *H01L 39/2422* (2013.01); *H01L 39/2487* (2013.01); *H01P 7/06* (2013.01); *H01P 11/008* (2013.01)

(58) Field of Classification Search
CPC ....................................................... H05H 7/20
See application file for complete search history.

(56) References Cited

U.S. PATENT DOCUMENTS

| | | | | |
|---|---|---|---|---|
| 4,531,982 | A | * 7/1985 | Dubots | H01L 39/2409 148/96 |
| 4,988,919 | A | * 1/1991 | Tanabe | H05H 7/18 313/360.1 |
| 5,689,875 | A | 11/1997 | Kanithi | |
| 6,097,153 | A | * 8/2000 | Brawley | H05H 7/20 219/121.63 |
| 7,276,708 | B2 | 10/2007 | Barov | |
| 7,411,361 | B2 | 8/2008 | Agustsson et al. | |
| 8,042,258 | B2 | * 10/2011 | Sennyu | H05H 7/20 29/599 |
| 8,088,714 | B2 | * 1/2012 | Singer | H01P 11/008 505/300 |

(Continued)

OTHER PUBLICATIONS

Moeckly et al. "Growth of high quality large area MgB2 thin films by reactive evaporation" Moeckly B H and Ruby W S 2006 Supercond. Sci. Technol. 19 L21 (Year: 2006).*

*Primary Examiner* — Paul A Wartalowicz

(74) *Attorney, Agent, or Firm* — Loza & Loza, LLP; Kevin L. Soules

(57) ABSTRACT

A system and method for fabricating accelerator cavities comprises forming at least two half cavities and joining the half cavities with a longitudinal seal. The half cavities can comprise at least one of aluminum, copper, tin, and copper alloys. The half cavities can be coated with a superconductor or combination of materials configured to form a superconductor coating.

11 Claims, 21 Drawing Sheets

(56) References Cited

U.S. PATENT DOCUMENTS

| | | | | |
|---|---|---|---|---|
| 8,128,765 B2* | 3/2012 | Myneni | ................... | C22C 27/02 |
| | | | | 148/668 |
| 8,324,134 B2* | 12/2012 | Saito | ...................... | B21D 22/20 |
| | | | | 505/401 |
| 8,391,937 B1 | 3/2013 | Agassi et al. | | |
| 8,731,628 B1* | 5/2014 | Agassi | ..................... | H05H 7/20 |
| | | | | 505/210 |
| 9,352,416 B2* | 5/2016 | Khare | ................. | H01L 39/2406 |
| 9,380,695 B2* | 6/2016 | Dolgashev | ............... | H05H 7/02 |
| 9,786,464 B2* | 10/2017 | Lunin | ..................... | H01J 23/20 |
| 10,314,151 B2* | 6/2019 | Whittum | .................. | H05G 1/10 |
| 10,485,090 B2* | 11/2019 | Myneni | ................... | H05H 7/20 |
| 2007/0069126 A1* | 3/2007 | McIntyre | ................ | H05H 7/18 |
| | | | | 250/306 |
| 2008/0176751 A1 | 7/2008 | Tcaciuc et al. | | |
| 2016/0035531 A1* | 2/2016 | Lunin | .................... | H01J 25/78 |
| | | | | 505/210 |
| 2020/0083014 A1* | 3/2020 | Graves | ..................... | H01J 1/34 |

* cited by examiner

LONGITUDINALLY JOINED SUPERCONDUCTING RESONATING CAVITIES

CROSS REFERENCE TO RELATED PATENT APPLICATIONS

This patent application claims the priority and benefit under 35 U.S.C. § 119(e) of U.S. Provisional Patent Application Ser. No. 62/364,975, filed Jul. 21, 2016, entitled "LONGITUDINALLY JOINED SUPERCONDUCTING RESONATING CAVITIES." U.S. Provisional Patent Application Ser. No. 62/364,975 is herein incorporated by reference in its entirety.

STATEMENT OF GOVERNMENT RIGHTS

The invention described in this patent application was made with Government support under the Fermi Research Alliance, LLC. Contract Number DE-AC02-07CH11359 awarded by the U.S. Department of Energy. The Government has certain rights in the invention.

BACKGROUND

Radio-frequency (RF) cavity resonators are a fundamental component in particle accelerators. RF cavity resonators are used to accelerate charged particles via resonant electromagnetic fields therein.

Prior art RF cavity resonators are made from an electrically conductive material, and generally include one or more specially shaped chambers. Each chamber shape is explicitly chosen according to the desired resonance conditions for the application. Prior art cavity resonators were, at one time, formed from copper. More recently, however, copper cavities have increasingly been replaced by cavities formed from superconducting material, in order to provide a more attenuated beam.

In some cases, RF cavity resonators are manufactured from niobium metal. Niobium is refractory and requires highly convergent electron or laser beams to create the high-purity fully penetrating weld necessary to ensure the cavity is vacuum tight. In general, cavity geometry has axial symmetry. Thus, in prior art, system components are usually rotated under a fixed focal location of the weld beam in order to join parts of the cavity. As a result, certain seam geometry in a niobium cavity is not possible because of the difficulty in translating either the part or the focal position along the undulating profile of the cavity.

While RF resonator cavities formed from superconducting materials are very useful for a number of applications, they are also very difficult to assemble, disassemble, and/or reassemble because the materials involved generally have extraordinarily high melting points. As a result, in some prior art approaches circumferential seams are used to manufacture a cavity. Such circumferential seams alter the characteristics of the RF current present in the cavity and in turn negatively affect particle acceleration.

As such, improved methods and systems for joining pieces used to form RF cavity resonators are required.

BRIEF SUMMARY

The following summary is provided to facilitate an understanding of some of the innovative features unique to the embodiments disclosed and is not intended to be a full description. A full appreciation of the various aspects of the embodiments can be gained by taking the entire specification claims, drawings, and abstract as a whole.

It is, therefore, one aspect of the disclosed embodiment to provide radio frequency (RF) resonating cavities.

It is another aspect of the disclosed embodiments to provide methods and systems for assembling RF resonating cavities.

It is another aspect of the disclosed embodiments to provide a method and system for joining one or more sections of RF resonating cavities.

It is another aspect of the disclosed embodiments to provide methods and systems for improved assembly of RF resonating cavities utilizing longitudinally joined sections of the RF resonating cavities.

For example, in the embodiments disclosed herein, a method for fabricating accelerator cavities comprises forming at least two pieces of an RF resonating cavity and joining the at least two pieces of the RF resonating cavity with a longitudinal seal thereby forming an RF resonating cavity. The pieces of the RF resonating cavity can comprise at least one of aluminum, copper, tin, and copper alloys. The at least two pieces of the RF resonating cavity can be coated with a superconductor which can include niobium, $MgB_2$, and $Nb_3Sn$. In certain embodiments, the RF resonating cavity can be heat treated in order to manipulate the characteristics of the coating. In other embodiments, patterning and lithographic processes can be applied to surfaces of the RF resonating cavity to tailor an electric field configuration therein.

BRIEF DESCRIPTION OF THE FIGURES

The accompanying figures, in which like reference numerals refer to identical or functionally-similar elements throughout the separate views and which are incorporated in and form a part of the specification, further illustrate the embodiments and, together with the detailed description, serve to explain the embodiments disclosed herein.

DETAILED DESCRIPTION

Figure 1:
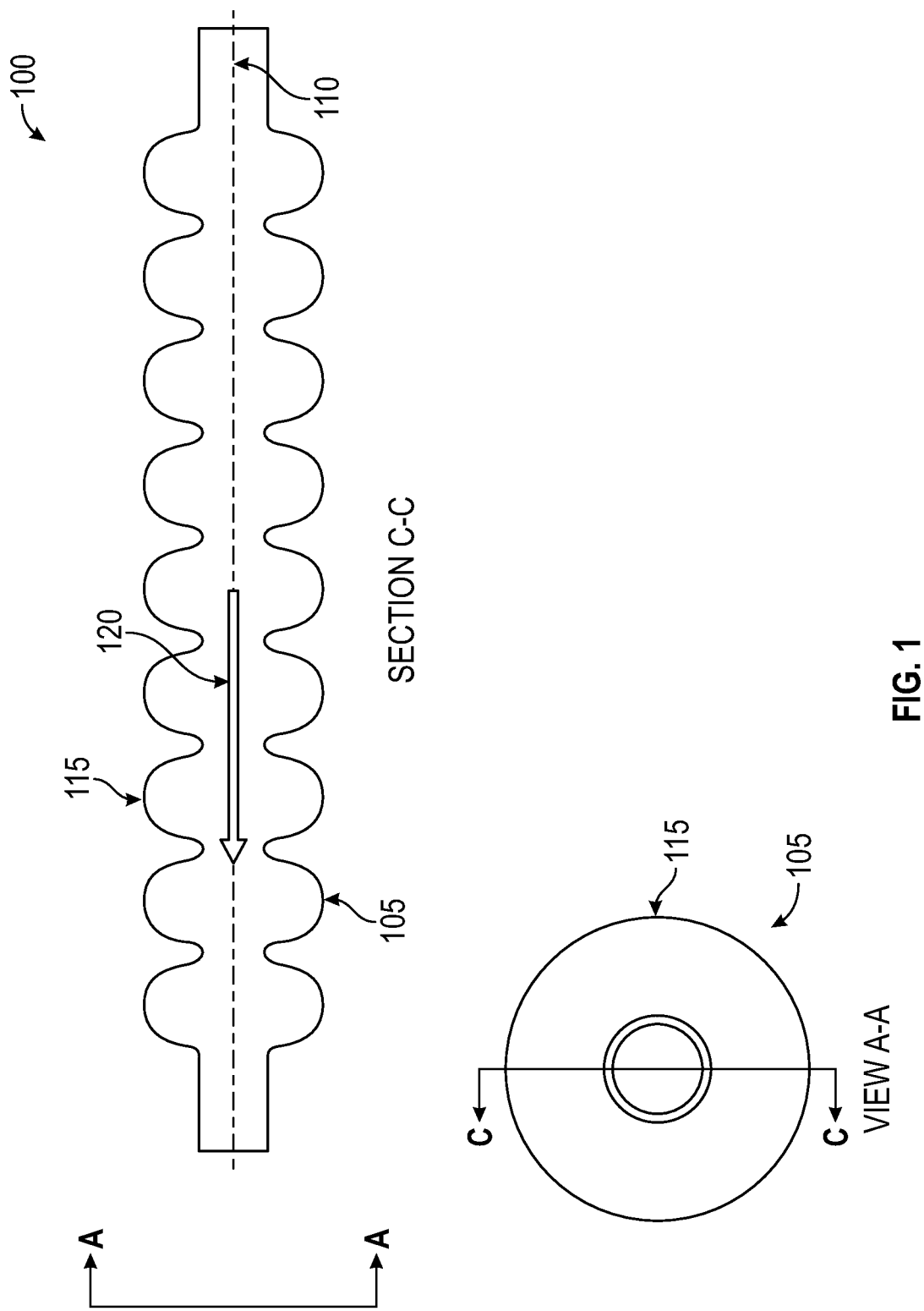
FIG. 1 illustrates a multi-cell RF resonating cavity formed with a longitudinal seam in accordance with the disclosed embodiments.

The particular values and configurations discussed in the following non-limiting examples can be varied, are cited merely to illustrate one or more embodiments, and are hot intended to limit the scope thereof.

Example embodiments will now be described more fully hereinafter with reference to the accompanying drawings, in which illustrative embodiments are shown. The embodiments disclosed herein can be embodied in many different forms and should not be construed as limited to the embodiments set forth herein; rather, these embodiments are provided so that this disclosure will be thorough and complete, and will fully convey the scope of the embodiments to those skilled in the art. Like numbers refer to like elements throughout.

The terminology used herein is for the purpose of describing particular embodiments only and is not intended to be limiting. As used herein, the singular forms "a," "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Throughout the specification and claims, terms may have nuanced meanings suggested or implied in context beyond an explicitly stated meaning. Likewise, the phrase "in one embodiment" as used herein does not necessarily refer to the same embodiment and the phrase "in another embodiment" as used herein does not necessarily refer to a different embodiment. It is intended, for example, that claimed subject matter include combinations of example embodiments in whole or in part.

In general, terminology may be understood at least in part from usage in context. For example, terms such as "and," "or," or "and/or" as used herein may include a variety of meanings that may depend at least in part upon the context in which such terms are used. Typically, "or" is used to associate a list, such as A, B, or C, is intended to mean A, B, and C, here used in the inclusive sense, as well as A, B, or C, here used in the exclusive sense. In addition, the term "one or more" as used herein, depending at least in part upon context, may be used to describe any feature, structure, or characteristic in a singular sense or may be used to describe combinations of features, structures, or characteristics in a plural sense. In addition, the term "based on" may be understood as not necessarily intended to convey an exclusive set of factors and may, instead, allow for existence of additional factors not necessarily expressly described, again, depending at least in part on context.

Unless otherwise defined, all terms (including technical and scientific terms) used herein have the same meaning as commonly understood by one of ordinary skill in the art. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

In accordance with the embodiments disclosed herein, RF resonating cavities, such as RF resonating cavity 105, generally comprise a chamber, or series of closed chambers, as shown in FIG. 1. FIG. 1 illustrates a side view of a series of closed resonating cavities 105 that form a multi-cell RF resonating cavity 100. FIG. 1 also provides a head on view of an RF resonating cavity 105.

The RF resonating cavities 105 associated with the multi-cell RF resonating cavity 100 can be made from electrically conductive materials, superconducting materials, or some combination thereof, including coating a shell 115 of the resonating cavities 105 with a desired material.

The multi-cell RF resonating cavity 100 can be used to accelerate charged particles along the alignment axis of the cavity illustrated by arrow 120. Electrical currents, which result from accelerating waves, tend to run along the interior walls of the multi-cell RF resonating cavity 100 in the direction defined by the axis of acceleration. The embodiments disclosed herein provide improved methods and systems or forming RF resonating cavities, such as multi-cell RF resonating cavity 100.

Figure 2A:
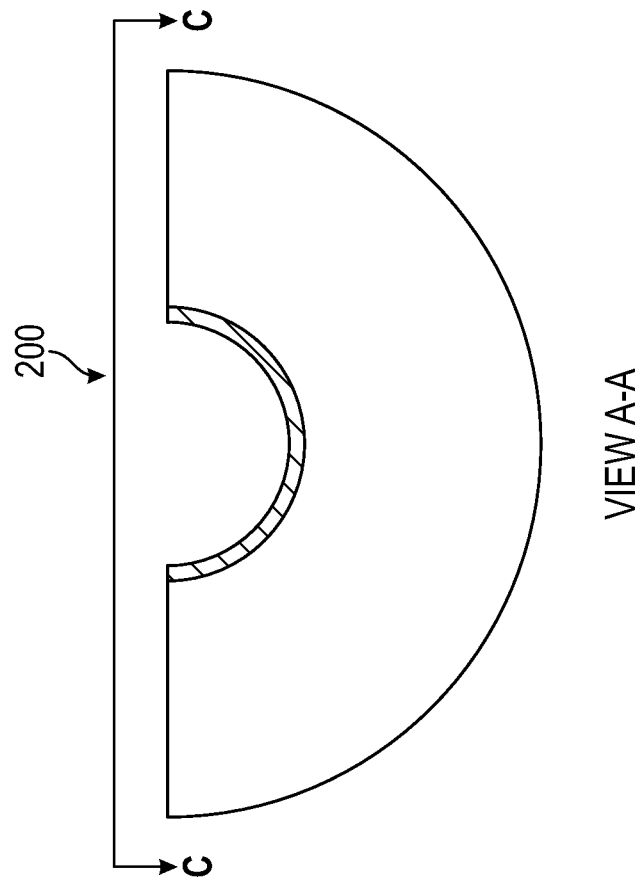
FIG. 2A illustrates a half cell of a RF resonating cavity in accordance with the disclosed embodiments.
Figure 2A:
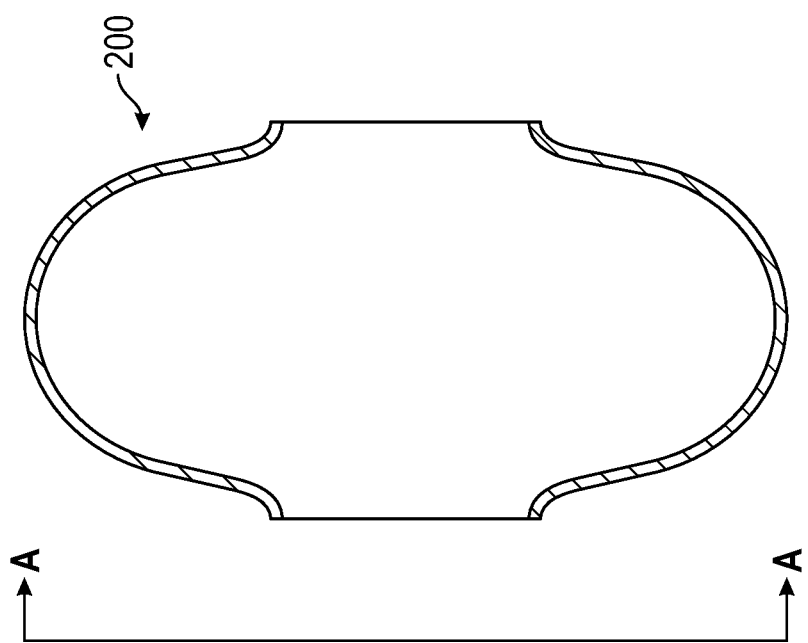

FIG. 2A illustrates a half-cavity piece, or "half-cell blank" 200, of an RF resonating cavity chamber 105 in accordance with the systems and methods disclosed herein. Two identical half-cell pieces, such as half-cell blank 200, comprise the opposing halves of an RF resonating cavity 105 that can be joined by a longitudinal seam 110, in accordance with the disclosed embodiments. The half-cell blank 200 can be produced using punch and die stamping of a copper sheet or other such known means. It should be understood that in certain embodiments, multi-celled half-cell blanks associated with a series of chambers 105 can be used to create a multi-cell RF resonating cavity, such as multi-cell RF resonating cavity 100.

Longitudinal seams can be used to connect, close, and/or seal multiple part-cavity pieces (i.e., two half-cell blanks 200) in order to form a completed resonating cavity chamber 105 or multi-cell RF resonating cavity chamber 100. Joining two half-cell blanks 200 can include a vacuum seal that can be produced by welding, brazing, soldering, or other bonding techniques, as appropriate for the choice of electrically conductive material. It should be understood that, any of these and other joining methods may be used for the joining of cavity pieces as described herein. In such embodiments, the longitudinal seam (or seals) 110 can be formed by such joining procedures.

Figure 2B:
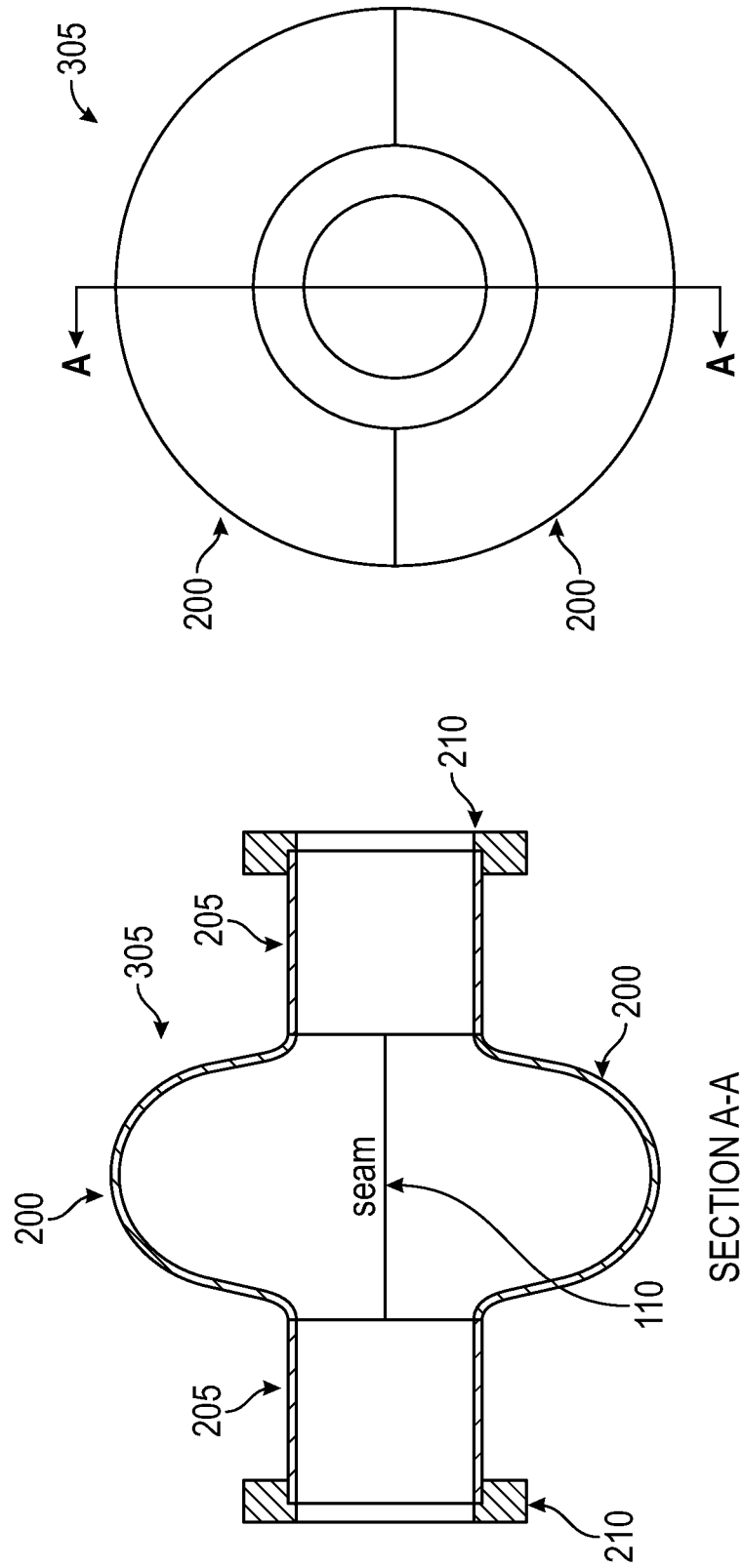
FIG. 2B illustrates a single celled RF resonating cavity formed with a longitudinal seam in accordance with the disclosed embodiments.

FIG. 2B illustrates two half-cell blanks 200 joined with a longitudinal seam 110, thereby forming a single celled RF resonating chamber 305 according to the methods disclosed herein, in accordance with the disclosed embodiments. In the embodiment illustrated in FIG. 2B, the beam tubes 205 are seamless. In other embodiments, the beam tubes 205 can similarly be joined using a longitudinal seam as described herein. FIG. 2B also illustrates flange 210 which may form a part of the RF resonating cavity in certain embodiments.

In other embodiments, a multi-cell RF resonating cavity 100 can be formed according to the same method illustrated in FIGS. 2A and 2B, which shows the means for manufacturing a single celled resonating chamber 305. In such embodiments, one or more longitudinal seams 110 can be used to join multi-cell half-cavity blanks to form a multi-celled RF resonating chamber (e.g., multi-cell resonating cavity chamber 100).

The longitudinal seams 110 represent a significant improvement over previously used manufacturing methods for RF cavities. The longitudinal seam prevents interfaces that obstruct oscillating currents in the cell structure, thereby improving the efficiency of the resonating cavity 305 formed according to the manufacturing methods described herein.

Figure 3:
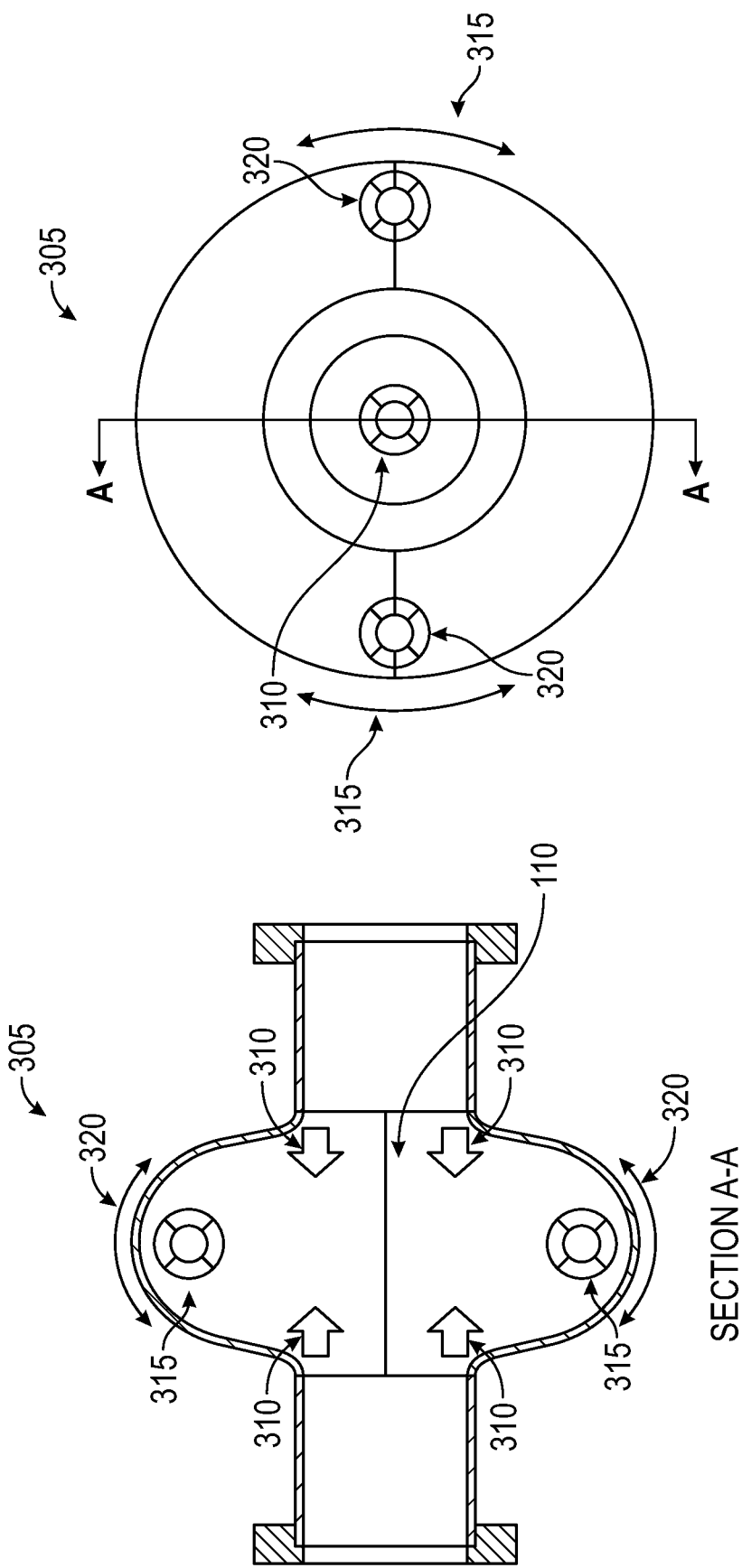
FIG. 3 illustrates a single celled RF resonating cavity with associated electro-magnetic fields in accordance with the disclosed embodiments.

FIG. 3 illustrates the electric field 310, magnetic field 315, and electric current 320 as they are oriented in the chamber 305. As illustrated in FIG. 3, an induced electric current 320 runs along the longitudinal axis of the chamber 305 under the application of an electric field 310 and its associated magnetic field 315. The electric field 310 provides particle acceleration. Fundamental laws of physics require an orthogonal magnetic field 315, and these mutual forces determine the orientation of induced current 320 along the chamber 305 surface.

In order to produce the desired particle acceleration, the electric field 310 must be aligned with the axis of the RF resonating cavity 305, along which the beam of charged particles moves. The applied electric field 310 is thus used to accelerate particles through the RF resonating cavity 305 in the desired direction.

By manufacturing the RF resonating cavity 305, according to the methods described herein, with a longitudinal seam 110, the induced RF current 320 does not cross the longitudinal seam 110. Unlike prior art manufacturing schemes, the longitudinal seam 110 does not run around the circumference of the RF resonating cavity 305, and thus, does not cross the path of the RF current 320. As a result the completed surface of the RF resonating cavity 305 does not alter the characteristics of the RF current and does not negatively affect the particle acceleration.

Figure 4A:
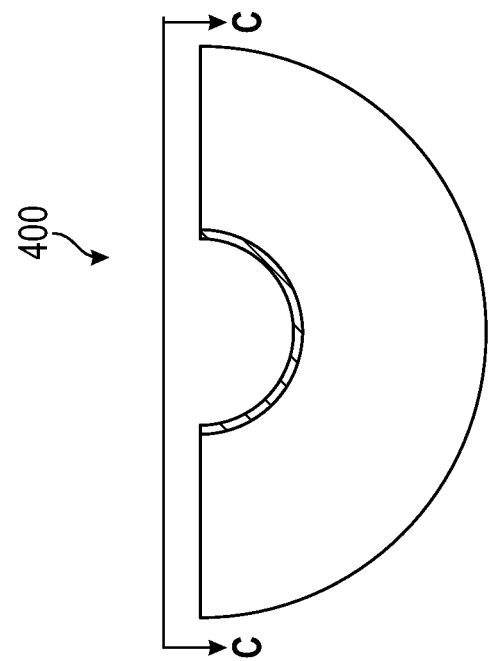
FIG. 4A illustrates a half-cell of an RF resonating cavity in accordance with the disclosed embodiments.
Figure 4A:
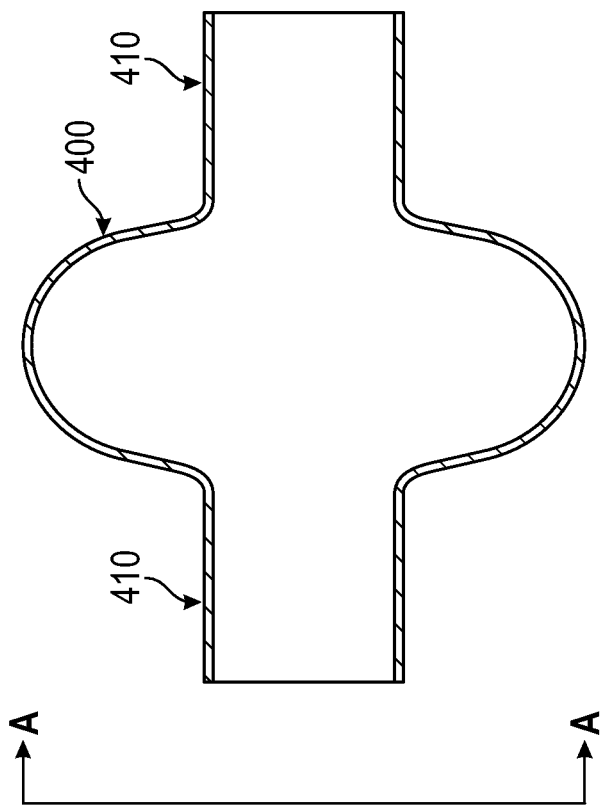

FIG. 4A illustrates a half-cell with tubes blank 400 in accordance with the embodiments disclosed herein. Two identical half-cell pieces, such as half-cell with tubes blank 400 comprise the opposing halves of an RF resonating cavity 405 with integrated beam tubes 410 joined by one or more longitudinal seams 110. FIG. 4A is provided to illustrate the ease of manufacture using the embodiments described herein. In particular, many cavities can be fabricated using one die and one geometry of stamped material.

In another embodiment, a plurality of cells (such as multi-cell cavity 100) can be fabricated using one die and one geometry of stamped material to form a multi-cell cavity, sealed with a longitudinal seam.

Figure 4B:
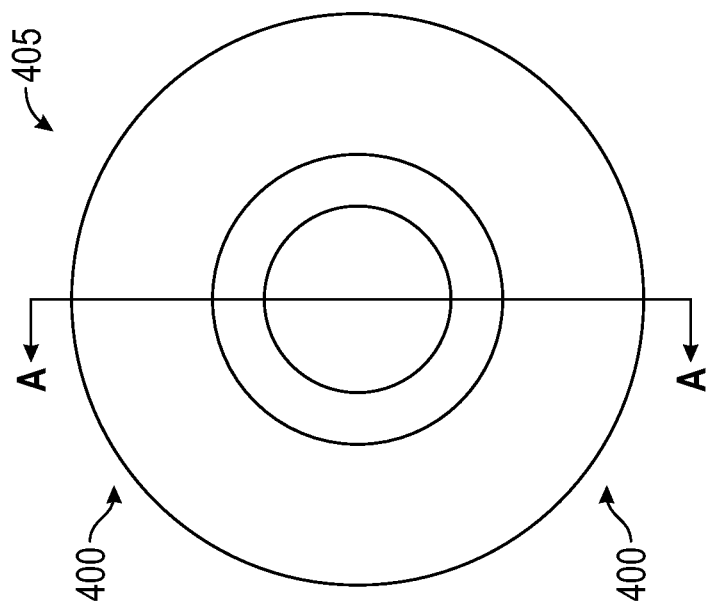
FIG. 4B illustrates a single celled RF resonating cavity formed with a longitudinal seam in accordance with the disclosed embodiments.
Figure 4B:
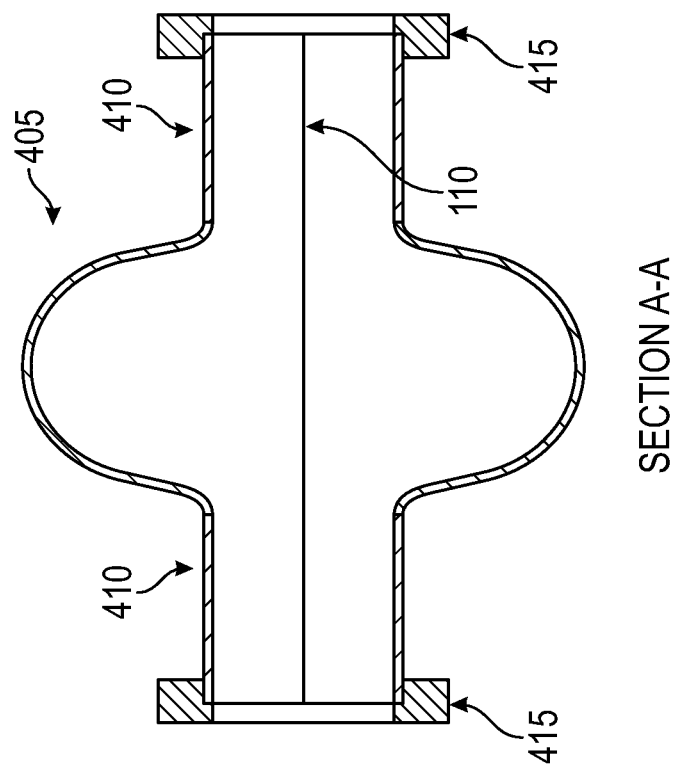

FIG. 4B illustrates a manufactured RF resonating cavity 405 formed by joining two identical half-cell with tubes blanks 400. The half-cell with tubes blanks 400 can be joined with a single longitudinal seam 110. Flanges 415 can further be configured onto the ends of the half-cell with tubes blanks 400.

As with the embodiments disclosed above, the longitudinal seam 110 does not cross the induced RF current present in the RF resonating cavity 405. It should be understood that, although FIG. 4B illustrates a single celled RF resonating cavity, in other embodiments multiple cavity cells could likewise be joined with a single longitudinal seam.

Joining half cavity pieces, or cavity pieces of other sizes with longitudinal seams as disclosed improves the ease of manufacturing RF resonating cavities. RF resonating cavities are generally formed of a super conducting material. For example, in some embodiments, half-cavity and part-cavity pieces can be fabricated by ordinary stamping or deep drawing of a material such as copper. The interior surfaces of the stamped blank can be subsequently coated with a superconducting material.

Figure 5A:
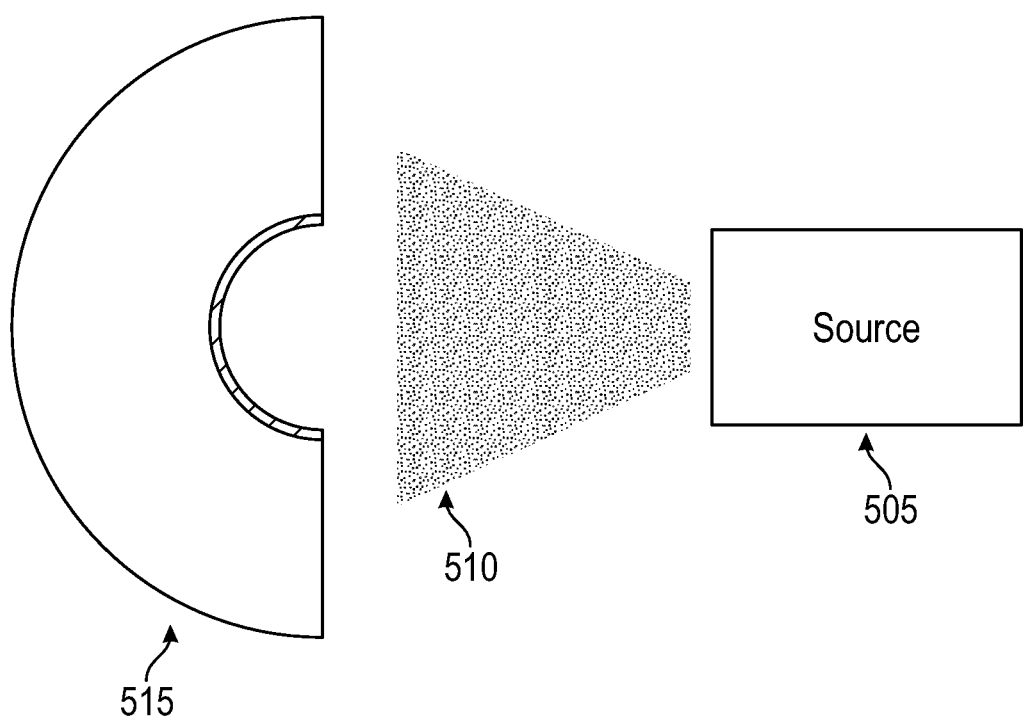
FIG. 5A illustrates a block diagram of a deposition source associated with the manufacture of an RF resonating cavity in accordance with an embodiment.
Figure 5B:
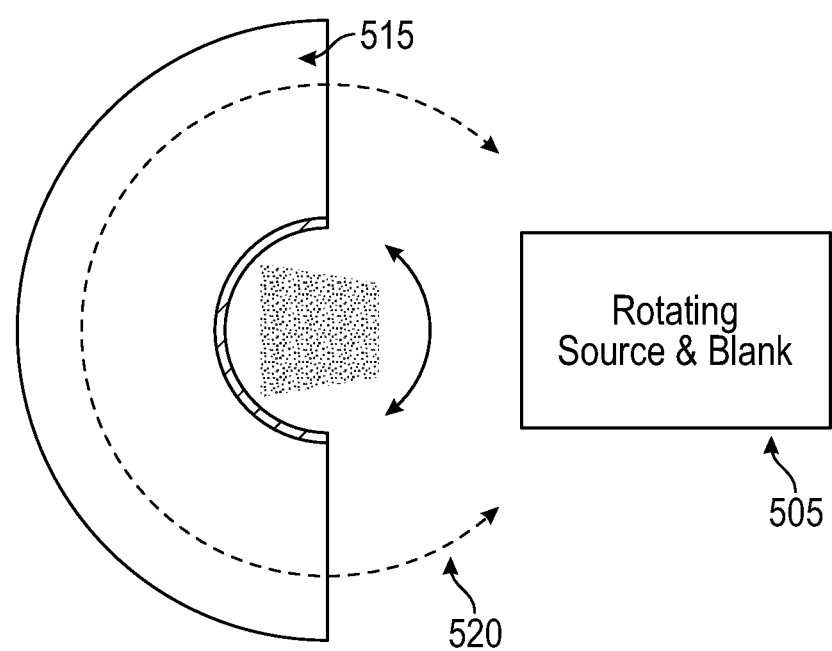
FIG. 5B illustrates a block diagram of a rotating deposition source associated with the manufacture of an RF resonating cavity in accordance with an embodiment.

FIG. 5A illustrates line of sight coating of a half-cell blank such as half-cell blank 515 in accordance with the methods and systems disclosed herein. In such embodiments, the half-cell blank 515 can be formed from copper (or other such material) and can be fabricated by stamping, deep drawings, or other such technique. A source 505 can emit, spray, or otherwise dispense coating 510. The source 505 can, for example, employ vacuum plasma spraying to directly form a superconductor coating on the exposed surface of the half-cell, blank 515. The source 505 can be aimed at, for example, an unassembled half-cell blank 515 or series of half-cell blanks 515. In certain embodiments, illustrated in FIG. 5B, the source 505 and/or blank 515 can be rotated, as illustrated by arrow 520, in order to provide coating on the desired portions of the half-cell blanks 515. The rotation ensures that a uniform coating can be applied to all portions of the half-cell blank 515.

The coating 510 can be a superconducting coating. In some embodiments, reactant precursors can be applied and the superconductor can be formed during a subsequent process such as a heat treatment cycle. In such embodiments, joining part-cavity pieces can precede the formation of the superconductor, in which case it may be possible to simultaneously form the vacuum seal as well as carry out a reaction that forms the superconducting material. This reaction may additionally serve to heal any seam.

A superconducting metal, such as pure niobium, can be applied, for example, by vacuum plasma spraying to directly form the superconductor coating. Alternatively, a plurality of materials, such as layers of niobium and bronze (a solution of tin in copper), can also be applied to the half-cell blank 515 to form a complex superconductor, such as $Nb_3Sn$ (triniobium stannide), also called "niobium stannide" or "niobium tin" in common trade, after the heat treatment is applied.

Figure 6:
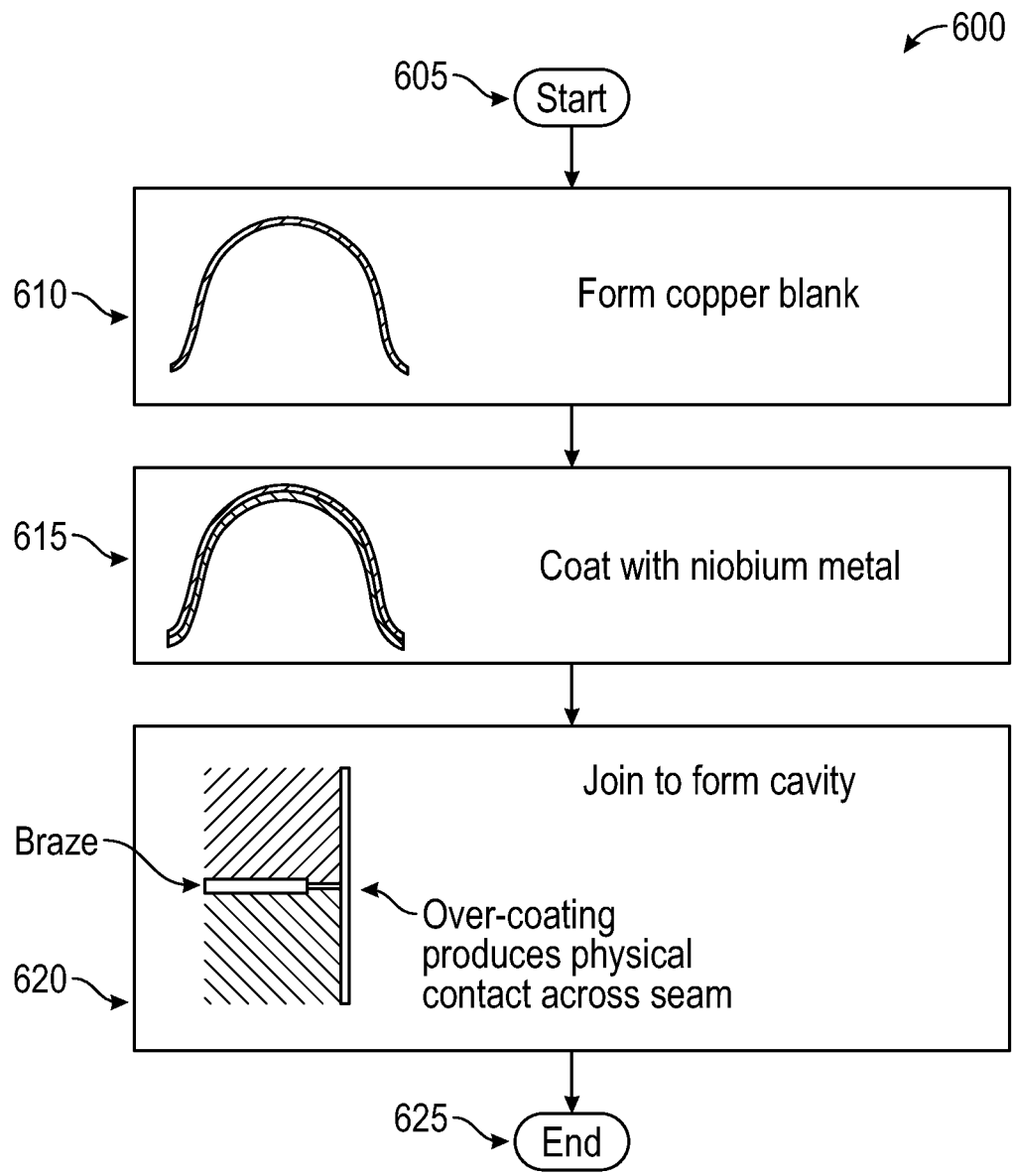
FIG. 6 illustrates a flow chart of steps associated with a method for manufacturing an RF resonating cavity, in accordance with an embodiment.

FIGS. 6-10 illustrate methods associated with the embodiments disclosed herein. In FIG. 6, a method 600 for creating a niobium on copper superconducting cavity is illustrated. The method begins at step 605. A copper blank can be formed as shown at step 610. The copper blank can comprise at least two cell pieces. For example, the copper blank can comprise two half-cell pieces. The cell pieces may also comprise multi-cell half-cell pieces. The cell pieces can be coated with niobium metal at step 615. The opposing half-cell pieces can then be joined with longitudinal seams as shown at step 620 in order to form a superconducting cavity. In some embodiments, brazing or other such mechanisms can be used to join the cell pieces. It should be understood that the niobium coating forms an over-coating that produces physical contact across the seam. The method ends at step 625.

Figure 7:
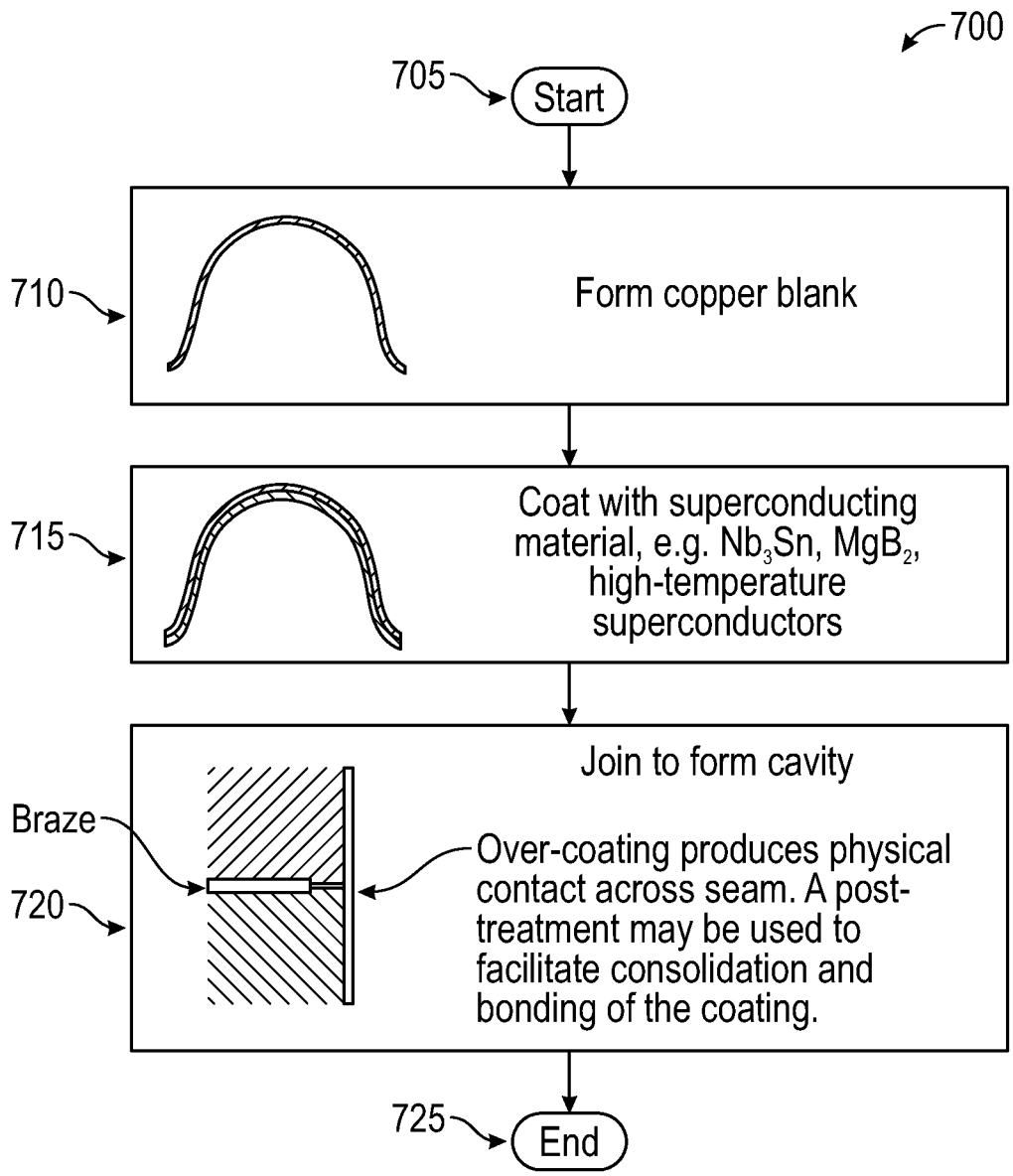
FIG. 7 illustrates a flow chart of steps associated with an additional method for manufacturing an RF resonating cavity, in accordance with an embodiment.

In another embodiment, FIG. 7 illustrates a method 700 for creating a superconducting RF resonating cavity by direct deposition. In this embodiment, the method begins at step 705, after which, a copper blank can be formed as shown at step 710. The copper blank can comprise at least two cell pieces, such as, for example, opposing half-cell pieces. The half-cell pieces may also comprise multi-cell half-cell pieces. The half-cell pieces can be coated with superconducting materials such as $Nb_3Sn$, $MgB_2$, or other high-temperature superconductors including $V_3Ga$, $Nb_3Al$, $FeSe_{0.5}Te_{0.5}$, and $Ba_{0.6}K_{0.4}BiO_3$, and $Nb_3Sn$ as shown at step 715. The opposing half-cell pieces can then be joined with longitudinal seams at step 720, in order to form a superconducting cavity. Again, the overcoating can produce physical contact across the seam. In certain embodiments, a post treatment can also be applied to facilitate consolidation and bonding of the coating. The method ends at step 725.

Figure 8:
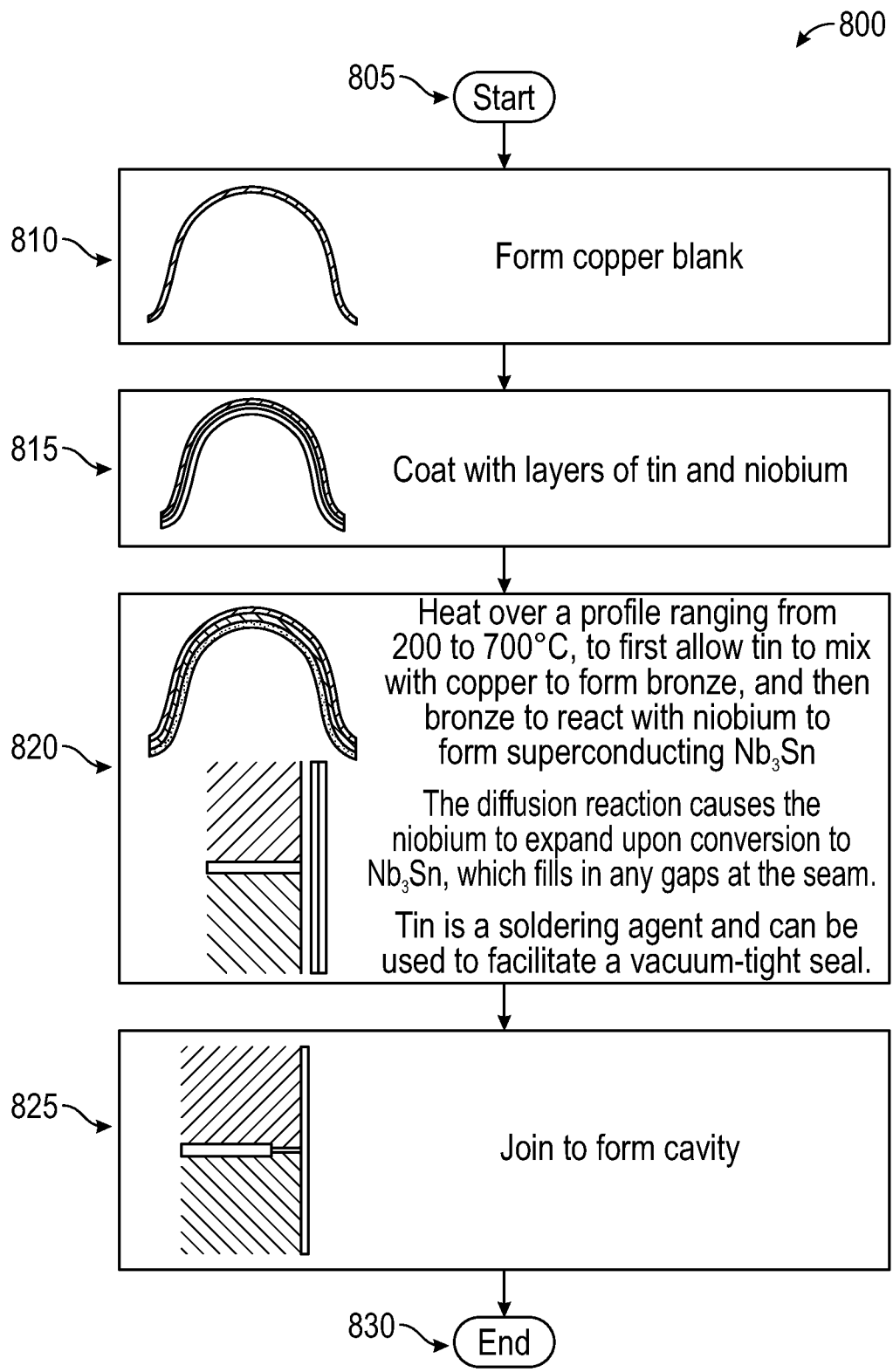
FIG. 8 illustrates a flow chart of steps associated with an additional method for manufacturing an RF resonating cavity, in accordance with an embodiment.

In another embodiment, illustrated in FIG. 8, a method 800 is described for forming an $Nb_3Sn$ coating on a copper cavity. The method begins at step 805. At step 810, a copper blank can be formed. The copper blank can comprise at least two cell pieces. The cell pieces can comprise opposing half-cell pieces or can comprise half multi-cell pieces in accordance with design considerations. The cell pieces can be coated with one or more layers of tin and niobium as shown at step 815.

Next at step 820, the coated cells can be heat treated with a heat profile ranging from 200-700 degrees C. The heat treatment temperature can be selected according to the type of coating and/or material of the cells. The heat treatment facilitates a direct reaction between the tin and niobium, resulting in the formation of $Nb_3Sn$. The reaction causes an expansion of the $Nb_3Sn$, which fills in gaps at the seams between the cell pieces. The cell pieces can then be joined with longitudinal seam in order to form a superconducting cavity at step 825. It should be appreciated that in alternative versions of the method 800, the cell pieces can be joined before heat treatment. The method ends at step 830.

In an alternative embodiment of FIG. 8, the heat treatment illustrated at step 820 can be performed in multiple stages. First, the cell pieces coated in tin can be heated to between 200 and 500 degrees C. This allows the tin to mix with the copper to form bronze. The bronze-coated cell pieces can be subsequently re-coated with niobium. The re-coated half-cell pieces can then be heated to between 500 and 1200 degrees C. The bronze then reacts with niobium to form superconducting $Nb_3Sn$. The opposing half-cell pieces can then be joined with longitudinal seams in order to form a superconducting RF resonating cavity. In an alternative embodiment, the cell pieces can also be joined with a longitudinal seam before the final heat treatment cycle, in order to form the superconducting RF resonating cavity.

Figure 9:
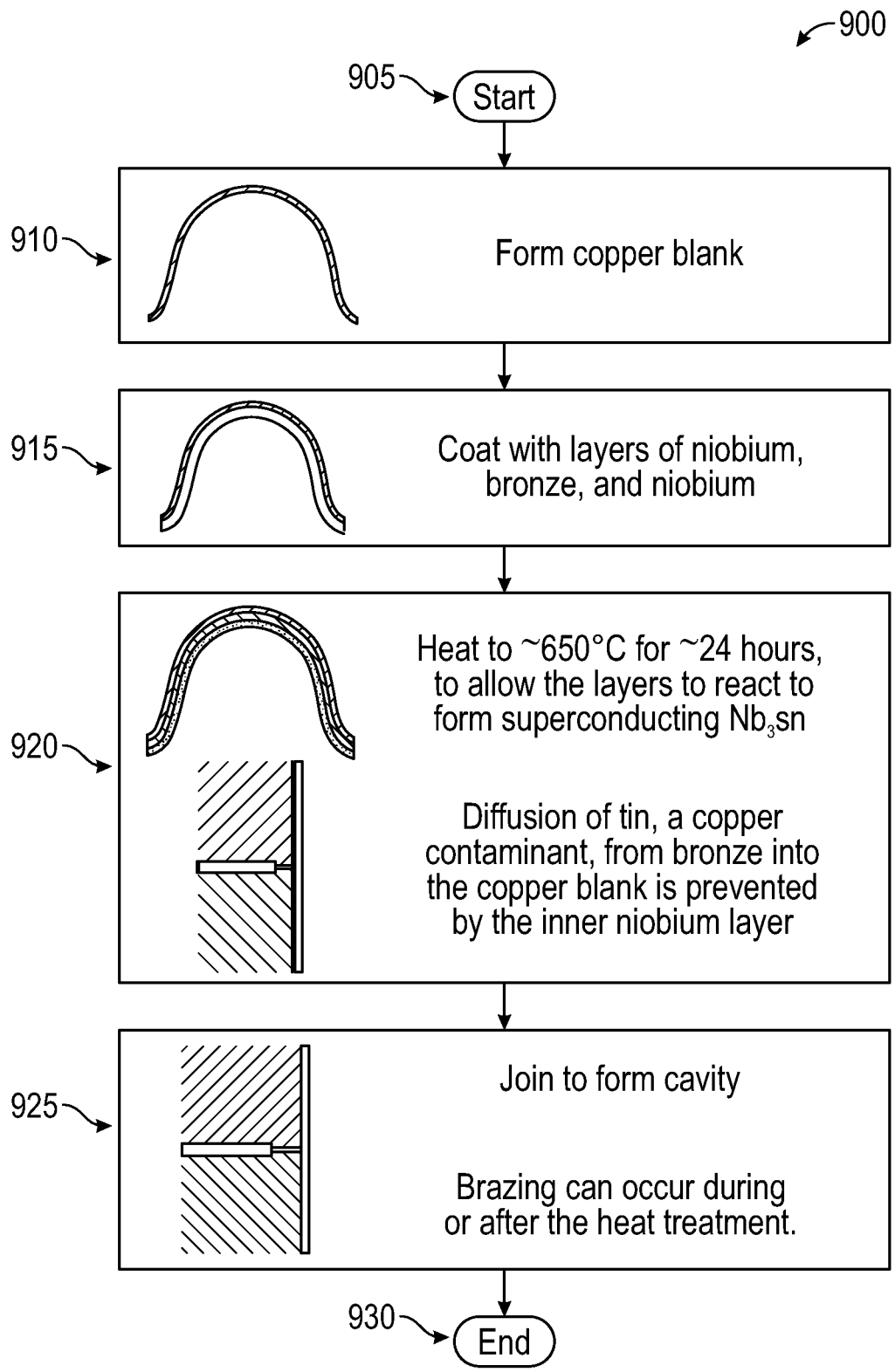
FIG. 9 illustrates a flow chart of steps associated with an additional method for manufacturing an RF resonating cavity, in accordance with an embodiment.

In another embodiment illustrated in FIG. 9, a method 900 is illustrated for creating a superconducting cavity of $Nb_3Sn$ on copper via a bronze-niobium reaction with a diffusion barrier. In this case, the method begins at step 905. At step 910, a copper blank can be formed. The copper blank can comprise at least two cell pieces. The cell pieces can be, for example, opposing half-cell pieces or half multi-cell pieces.

As illustrated at step 915, the cell pieces can be coated with sequential layers of niobium, bronze, and niobium. The coated cells are then subject to a heat treatment cycle at step 920 where the coated cells are heated to between 600 to 1200 degrees Celsius. The heat treatment facilitates reaction between the layers resulting in the formation of superconducting $Nb_3Sn$. The cell pieces can then be joined with longitudinal seams as shown at step 925 in order to form a superconducting RF resonating cavity. The method ends at step 930. It should be appreciated that, in an alternative embodiment, the cell pieces can be joined before the heat treatment cycle.

Figure 10:
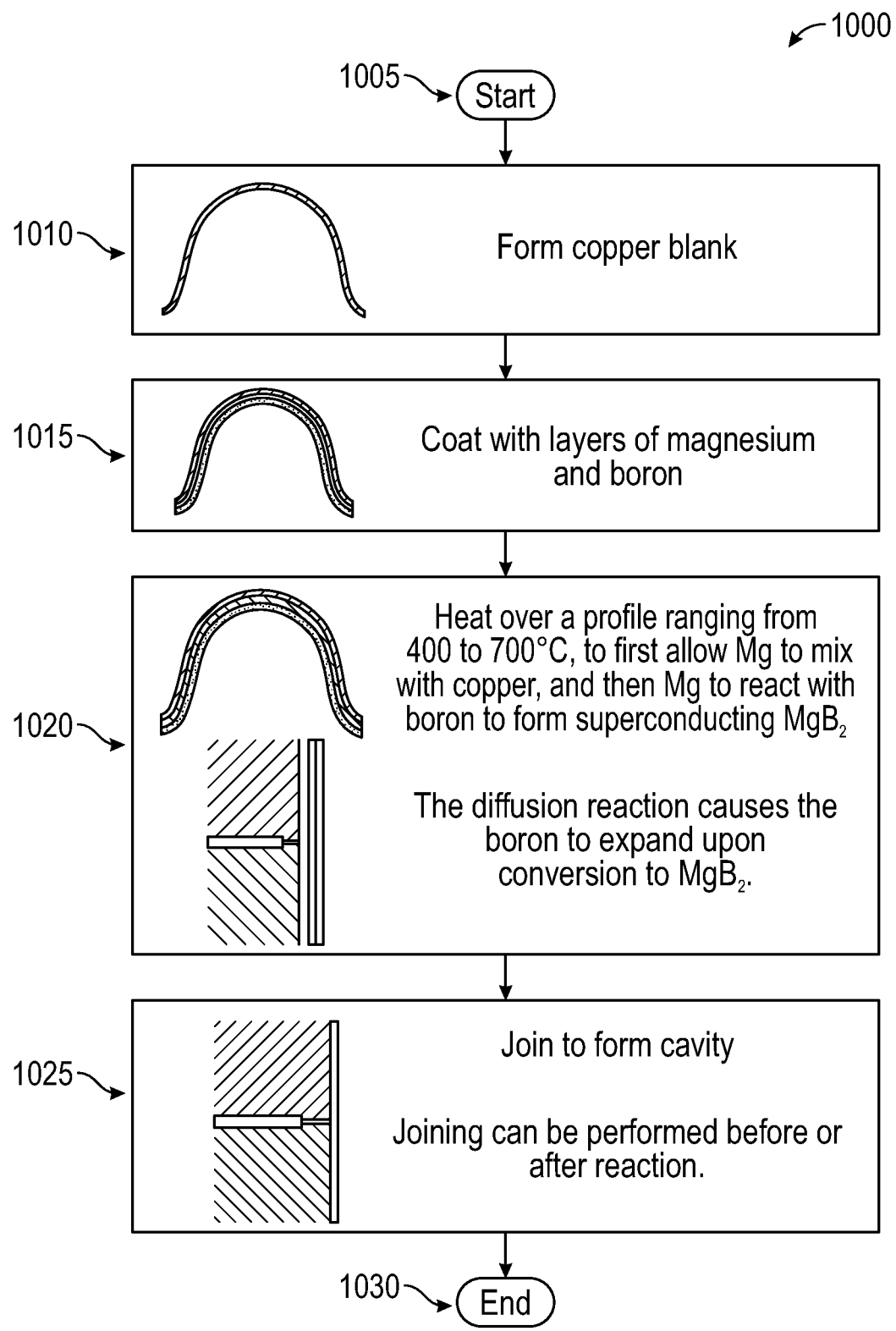
FIG. 10 illustrates a flow chart of steps associated with an additional method for manufacturing an RF resonating cavity, in accordance with an embodiment.

In yet another embodiment, FIG. 10 illustrates a method 1000 for creating a superconducting cavity of $MgB_2$ on copper via magnesium-copper and magnesium-boron reactions. The method begins at step 1005. A copper blank can be formed at step 1010. The copper blank can comprise at least two cell pieces. The cell pieces can comprise opposing half-cell pieces and/or half multi-cell pieces.

At step 1015, the cell pieces can be coated with one or more layers of magnesium and boron. The coated cells are then heat treated with a heat treatment cycle as illustrated at step 1020. The heat profile of the heat treatment cycle can range from 400-700 degrees C. The heat treatment allows the Mg to mix with copper. The Mg then reacts with the boron to form superconducting $MgB_2$. The cell pieces can then be joined with longitudinal seams at step 1025 in order to form a superconducting RF resonating cavity. The method ends at step 1030.

In an alternative embodiment, the cell pieces can be joined before the heat treatment cycle. In another alternative embodiment, the heat treatment to mix Mg with copper can precede the coating with boron. The cell pieces with Mg mixed with copper can then be re-coated with boron. The re-coated pieces can be heat treated with a profile between 600 and 900 degrees C., which allows Mg to react with boron to form superconducting $MgB_2$.

Figure 11:
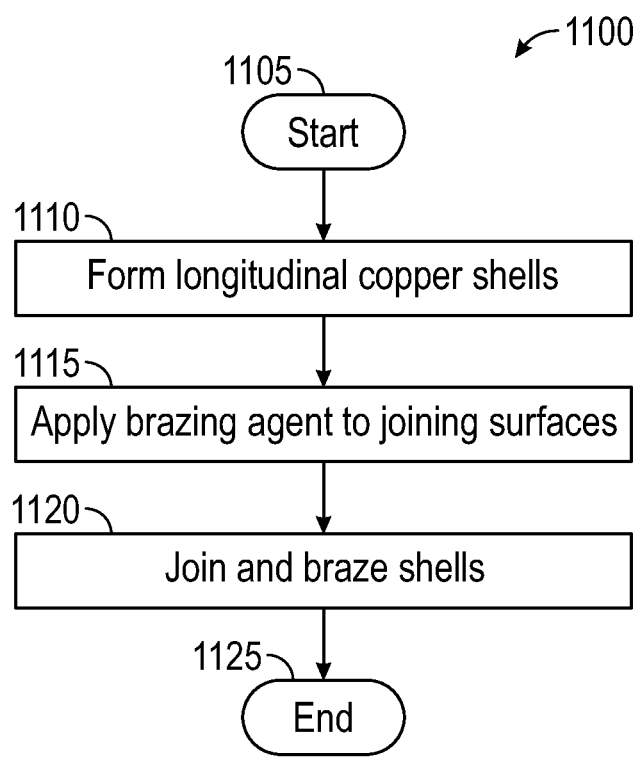
FIG. 11 illustrates a flow chart of steps associated with a method for joining pieces of a non-superconducting RF resonating cavity, in accordance with an embodiment.

FIGS. 11-18 provide flow charts of methods for forming RF resonating chambers associated with embodiments disclosed herein for a selection of materials and configurations FIG. 11 illustrates a method 1100 for forming an RF resonating chamber of non-superconducting copper. The method begins at step 1105. At step 1110, at least two RF chamber pieces can be formed from high purity copper. At step 1115, a brazing agent can be applied to the joining surfaces of the respective RF chamber pieces where they will be joined. The joint between the joining surfaces is oriented to be longitudinal, as disclosed herein. At step 1120 the copper RF chamber pieces can be joined and brazed to from an RF resonating chamber. In other embodiments soldering, TIG welding, laser welding, electron-beam welding, diffusion bonding, friction welding, and/or other joining techniques can be used to longitudinally join the RF chamber pieces. The method ends at step 1125.

Figure 12:
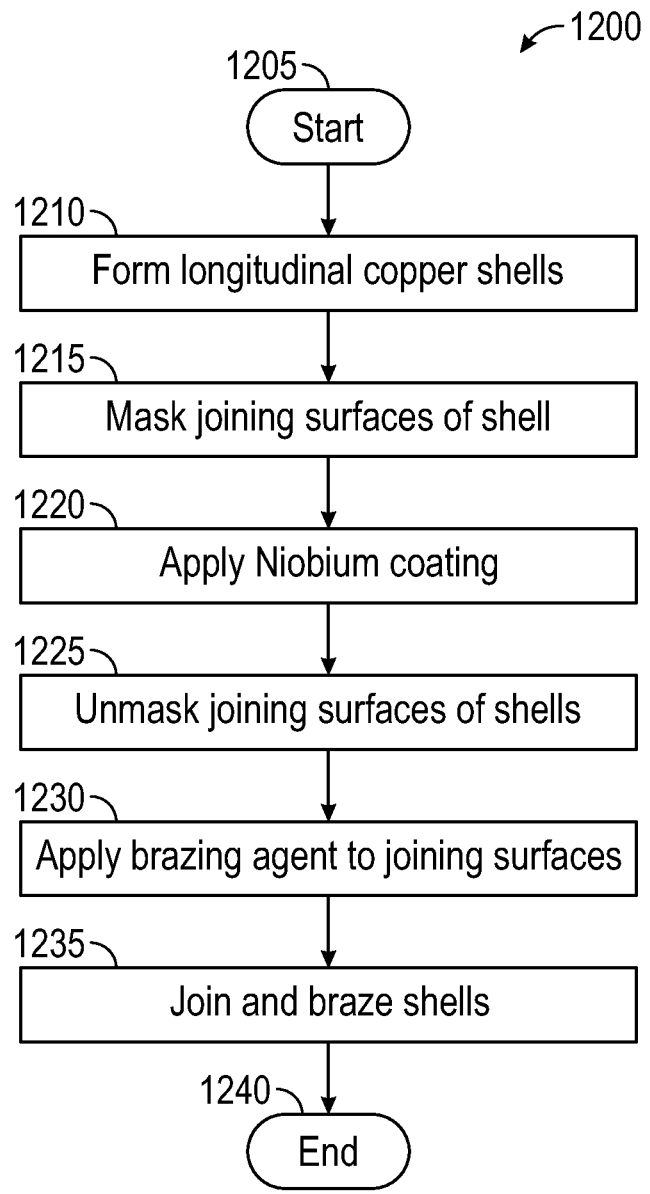
FIG. 12 illustrates a flow chart of steps associated with a method for joining pieces of a superconducting RF resonating cavity, in accordance with an embodiment.

FIG. 12 illustrates a method 1200 for forming a superconducting RF resonating chamber using copper and niobium. The method begins at step 1205. At step 1210, at least two RF chamber pieces can be formed from high purity copper. At step 1215, the joining surfaces of the chamber pieces can be masked, before a niobium coating is applied at step 1220. The niobium coating can be applied via vacuum plasma spray, physical vapor deposition, sputtering, ion-beam deposition, evaporation, laser ablation, and/or other such coating techniques. The joining surfaces of the chamber pieces can be unmasked at step 1225. At step 1230, a brazing agent can be applied to the joining surfaces of the respective RF chamber pieces where they will be joined. The joint between the joining surfaces is oriented to be longitudinal, as disclosed herein. At step 1235, the chamber pieces can be joined and brazed to from a superconducting RF resonating chamber. The method ends at step 1240.

Figure 13:
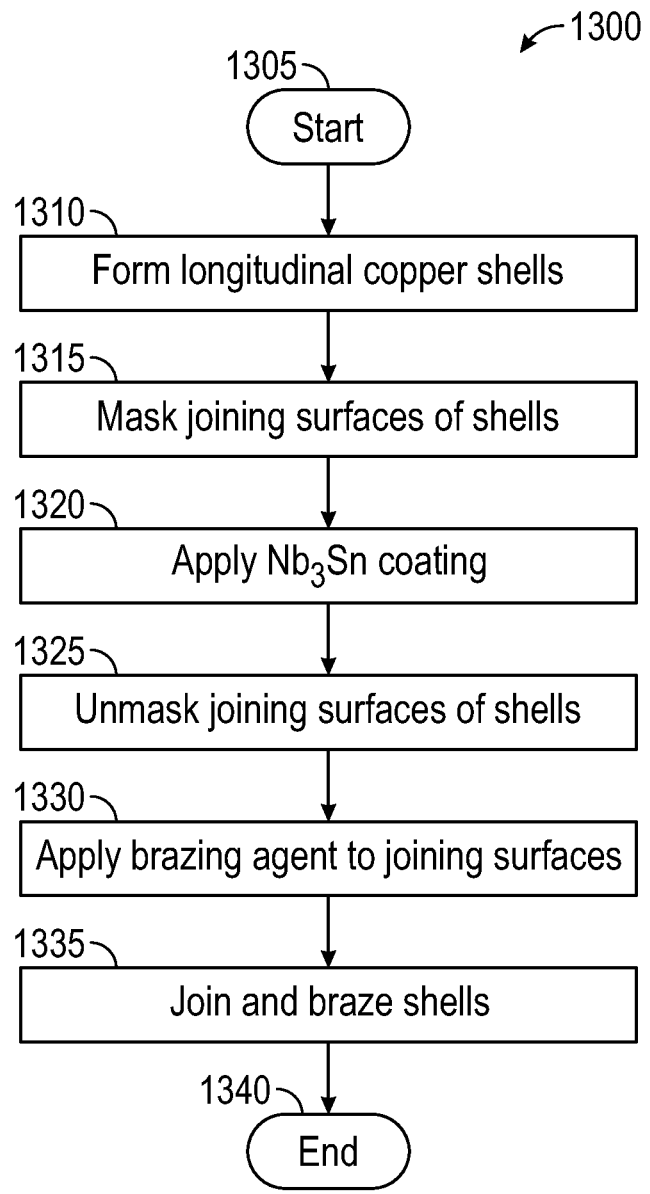
FIG. 13 illustrates a flow chart of steps associated with an additional method for joining pieces of a superconducting RF resonating cavity, in accordance with an embodiment.

FIG. 13 illustrates a method 1300 for forming a superconducting RF resonating chamber using copper and $Nb_3Sn$. The method begins at step 1305. At step 1310, at least two RF chamber pieces can be formed from high purity copper. At step 1315, the joining surfaces of the chamber pieces can be masked, before an $Nb_3Sn$ coating is applied at step 1320. In other embodiments, it should be understood that other superconducting materials may alternatively or additionally be applied at step 1315. The superconducting coating can be applied via physical vapor deposition. The joining surfaces of the chamber pieces can be unmasked at step 1325. At step 1330, a brazing agent can be applied to the joining surfaces of the respective RF chamber pieces where they will be joined. The joint between the joining surfaces is oriented to be longitudinal, as disclosed herein. At step 1335, the chamber pieces can be joined and brazed to from a superconducting RF resonating chamber. In other embodiments, soldering, TIG welding, laser welding, electron-beam welding, diffusion bonding, friction welding, and/or other joining techniques can be used to longitudinally join the RF chamber pieces according to the choice of superconducting material used to coat the RF chamber pieces. The method ends at step 1340.

Figure 14:
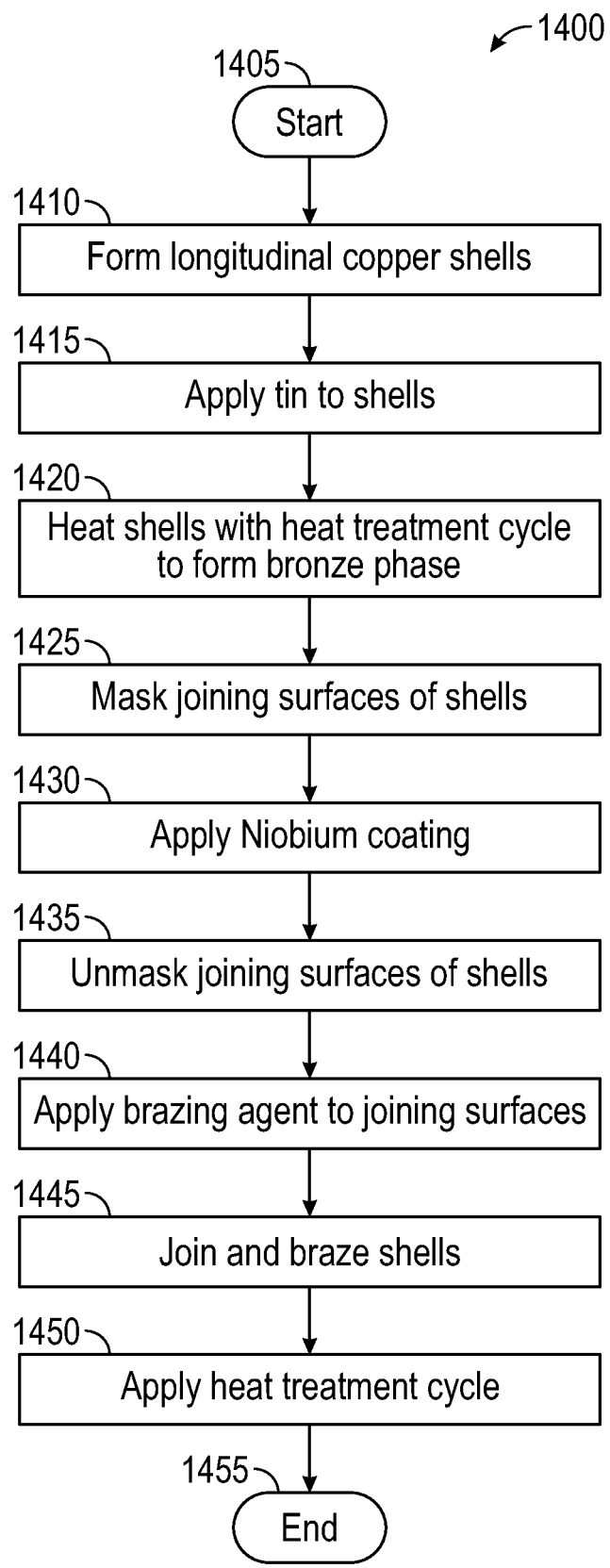
FIG. 14 illustrates a flow chart of steps associated with an additional, method for joining pieces of a superconducting RF resonating cavity, in accordance with an embodiment.

FIG. 14 illustrates a method 1400 for forming a superconducting RF resonating chamber using tin and $Nb_3Sn$. The method begins at step 1405. At step 1410, at least two RF chamber pieces can be formed from high purity copper. At step 1415, tin metal can be applied to the RF chamber pieces by evaporation and/or physical vapor deposition. Application of tin serves as a soldering or brazing agent when the RF chamber pieces are later joined and sealed. Next, at step 1420, the RF chamber pieces are subject to a heat treatment cycle of between 210 and 400 degrees Celsius to from a bronze phase, which is a solid solution of copper in tin (also known as the "alpha phase" in a copper-tin phase diagram). The joining surfaces of the chamber pieces can be masked at step 1425, before a niobium coating is applied at step 1430. The niobium coating can be applied via vacuum plasma spray and/or physical vapor deposition. The joining surfaces of the chamber pieces can be unmasked at step 1435. At step 1440, a high-temperature brazing agent can be applied to the joining surfaces of the respective RF chamber pieces where they will be joined. The joint between the joining surfaces is oriented to be longitudinal, as disclosed herein. At step 1445, the chamber pieces can be joined and brazed or welded to from a superconducting RF resonating chamber. The assembled RF resonating chamber can then be subject to a second heat treatment cycle at step 1450, where the assembly is heated a temperature between 630 and 700 degrees Celsius for two or more hours. The method ends at step 1455.

Figure 15:
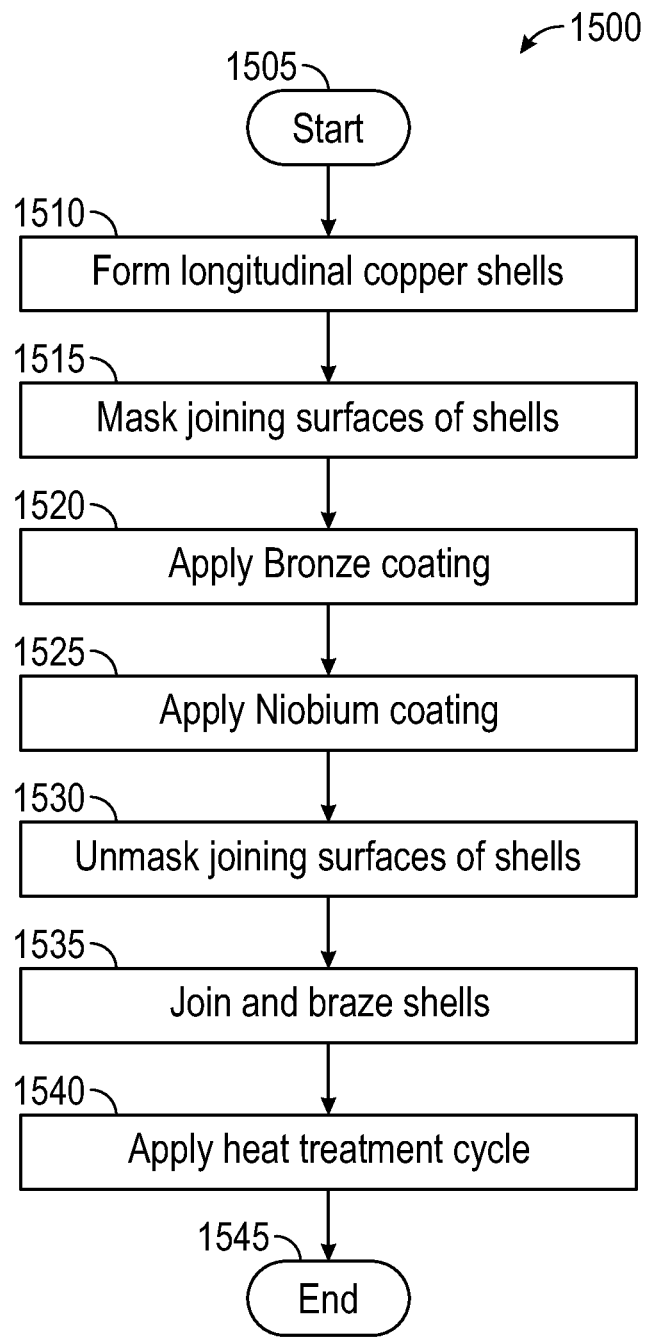
FIG. 15 illustrates a flow chart of steps associated with an additional method for joining pieces of a superconducting RF resonating cavity, in accordance with an embodiment.

FIG. 15 illustrates a method 1500 for forming a superconducting RF resonating chamber using layers of niobium and bronze. The method begins at step 1505. At step 1510, at least two RF chamber pieces can be formed from high purity copper. The joining surfaces of the chamber pieces can be masked at step 1515, before a first coating of bronze is applied at step 1520 via vacuum plasma spray. Next at step 1525, a coating of niobium is applied via vacuum plasma spray. It should be appreciated that other deposition methods such as physical vapor deposition may be used for providing the coating of bronze and niobium. The bronze coating should be at least three times thicker than the niobium coating to achieve the best properties, but other thicknesses may also be used in certain designs. The coating thickness should preferably be between 10 and 100 micrometers, although other thicknesses are also possible. The joining surfaces of the chamber pieces can be unmasked at step 1530. At step 1535, the chamber pieces can be joined to from a superconducting RF resonating chamber. The assembled RF resonating chamber can then be subject to a heat treatment cycle at step 1540, where the assembly is heated to a temperature between 630 and 700 degrees Celsius for two or more hours. The heat treatment cycle produces $Nb_3Sn$ and activates a brazing agent to seal the joined RF resonating chamber. The method ends at step 1545.

Figure 16:
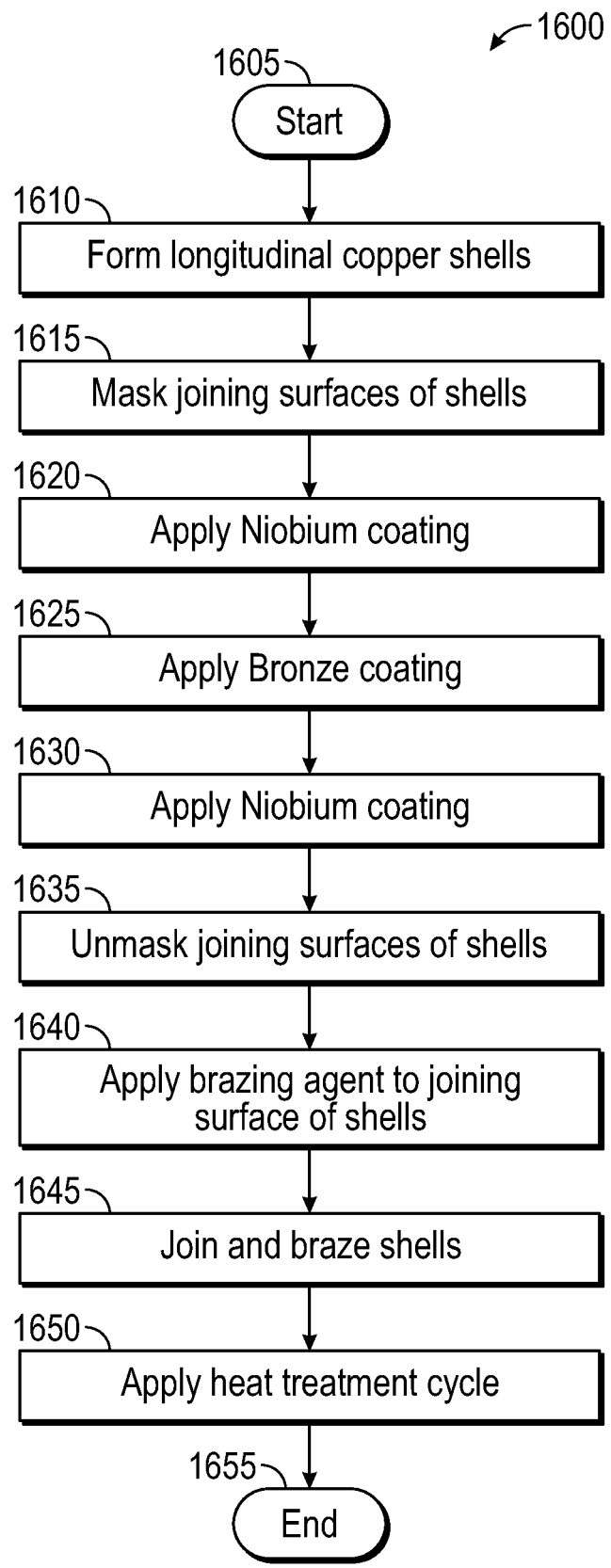
FIG. 16 illustrates a flow chart of steps associated with an additional method for joining pieces of a superconducting RF resonating cavity, in accordance with an embodiment.

FIG. 16 illustrates a method 1600 for forming a superconducting RF resonating chamber using layers of niobium and bronze. The method begins at step 1605. At step 1610, at least two RF chamber pieces can be formed from high purity copper. The joining surfaces of the chamber pieces can be masked at step 1615. A first coating of niobium can be applied via vacuum plasma spray at step 1620, a first coating of bronze is applied at step 1625 via vacuum plasma spray, and a second coat of niobium can be applied via vacuum plasma spray at step 1630. The first niobium coating should be thicker than the second niobium coating and the bronze coating is preferably three times thicker than the second niobium coating (other coating thicknesses are possible in other embodiments). The joining surfaces of the chamber pieces can be unmasked at step 1635. At step 1640, a high temperature brazing agent can be applied to the joining surface of the RF resonating chamber pieces. The chamber pieces can be joined to from a superconducting RF resonating chamber at step 1645. The assembled RF resonating chamber can then be subject to a heat treatment cycle at step 1650, where the assembly is heated a temperature between 630 and 700 degrees Celsius for two or more hours. The heat treatment cycle produces $Nb_3Sn$ and activates a brazing agent to seal the joined RF resonating chamber. The time and temperature of the heat treatment should be sufficient to consume the entire second layer of niobium, which results in the formation of $Nb_3Sn$. The first niobium layer serves as a diffusion barrier. The method ends at step 1655.

Figure 17:
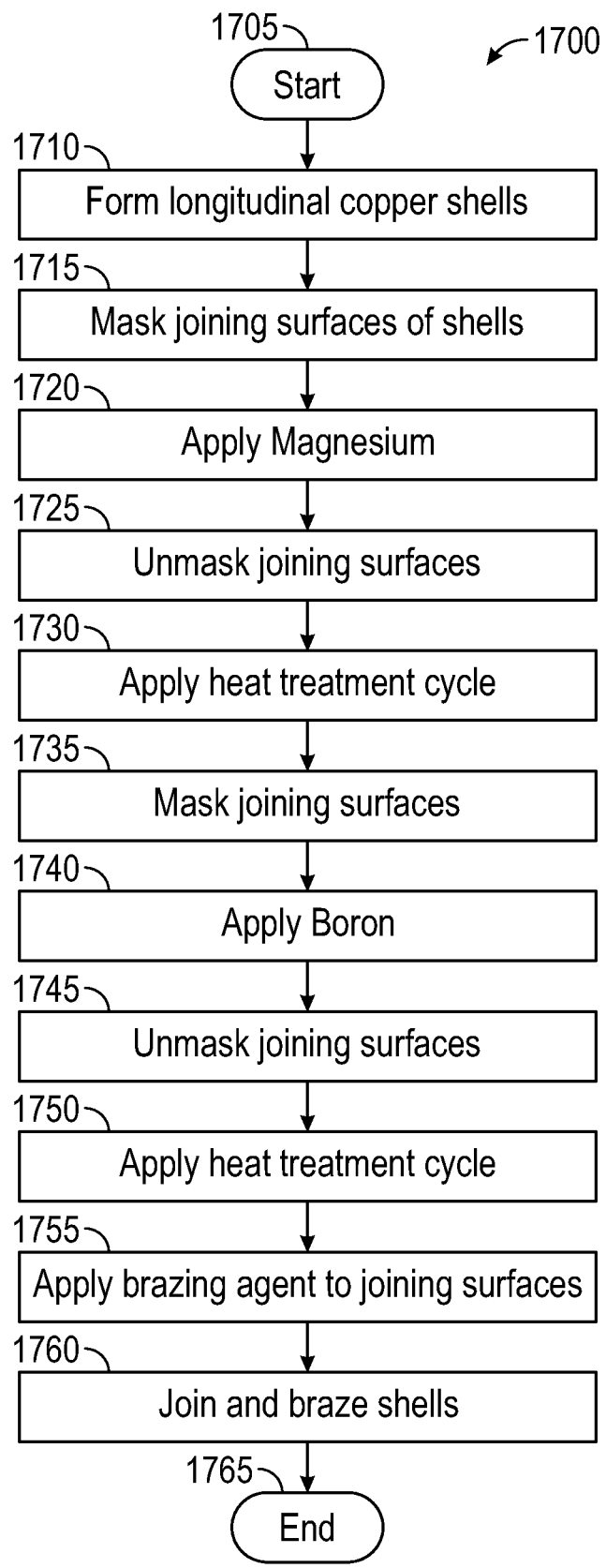
FIG. 17 illustrates a flow chart of steps associated with an additional method for joining pieces of a superconducting RF resonating cavity, in accordance with an embodiment.

FIG. 17 illustrates a method 1700 for forming a superconducting RF resonating chamber. The method begins at step 1705. At step 1710, at least two RF chamber pieces can be formed from high purity copper. The joining surfaces of the chamber pieces can be masked at step 1715. Magnesium can be applied to the copper via evaporation or physical vapor deposition at step 1720. The joining surfaces of the chamber pieces can be unmasked at step 1725, and then a heat treatment cycle can be applied to the shell chambers at step 1730. The heat treatment cycle is preferably applied at 400 to 500 degrees Celsius in order to form magnesium bronze. The joining surfaces of the chamber pieces can again be masked at step 1735. Boron can be applied to the chambers at step 1740 via physical vapor deposition. The joining surfaces of the chamber pieces can be unmasked at step 1745. A second heat treatment cycle can be applied at step 1750, where the shells are heated to a temperature between 630 and 700 degrees Celsius for one hour (other times may alternatively be used). At step 1755, a high temperature brazing agent can be applied to the joining surface of the RF resonating chamber pieces. The chamber pieces can be joined to from a superconducting RF resonating chamber at step 1780. In this case, the superconductor formed is $MgB_2$ The method ends at step 1765.

Figure 18:
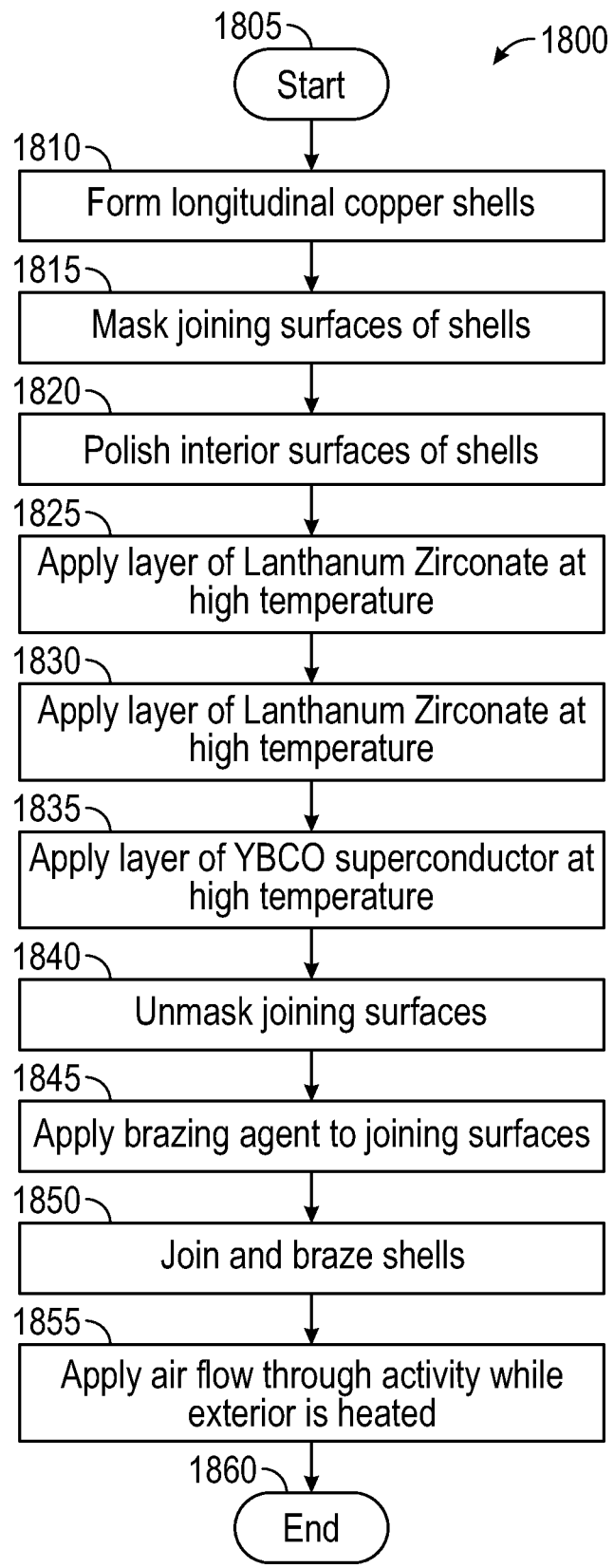
FIG. 18 illustrates a flow chart of steps associated with an additional method for joining pieces of a superconducting RF resonating cavity, in accordance with an embodiment.

FIG. 18 illustrates a method 1800 for forming a superconducting RF resonating chamber. The method begins at step 1805. At step 1810, at least two RF chamber pieces can be formed from high purity copper. The joining surfaces of the chamber pieces can be masked at step 1815. At step 1820, the interior surfaces of the RF chamber shell pieces can be polished. Next at step 1825, a layer of lanthanum zirconate can be applied via metal-organic deposition. This step can be performed at high temperature. At step 1830, a second layer of lanthanum zirconate can be applied via metal-organic deposition, again at high temperature. It should be appreciated that other materials include lanthanum aluminate, strontium titanate, magnesium oxide, and other materials. A coating of YBCO superconductor can then be applied via metal-organic deposition at step 1835, again at high temperature. The joining surfaces of the chamber pieces can be unmasked at step 1840. A brazing agent is applied to the joining surface of the RF resonating chamber pieces at step 1845. The chamber pieces can be joined to from a superconducting RF resonating chamber at step 1850. Airflow can then be applied through the formed cavity interior while the exterior of the cavity is heated to a temperature of or around 400 degrees Celsius at step 1855. This optimizes the YBCO Properties. The method ends at step 1880.

Reactions described above takes place at temperatures as low as 600° C. Direct reaction of Sn and Nb to produce $Nb_3Sn$ of good quality requires treatment at 1100° C. or higher. The presence of copper suppresses thermodynamic equilibrium with unwanted $Nb_6Sn_5$ and $NbSn_2$ which otherwise occur during reactions below 910° C.

Longitudinal copper cavities can incorporate copper-magnesium and boron layers to produce $MgB_2$ as the superconductor coating after reaction above approximately 700° C.

In summary, the embodiments disclosed herein provide improved methods and systems for manufacturing RF resonant cavities. As illustrated in the methods disclosed herein, the convenience of line-of-sight deposition permits many different materials and combinations of materials to be applied, allowing the cavity manufacture to be easily tailored to suit the parameters of operation.

Because superconductors provide substantially increased efficiency in operating a cavity (with a significant trade-back of efficiency related to cooling requirements), access to a variety of superconducting materials permits flexibility to adjust efficiency, refrigeration trade-back, material cost, and other factors to suit an application.

For cavity resonators that accelerate electron beams with high duty factor, substantial heat can build up on the cavity walls. Copper, aluminum, or other such thermal conductor can be used as the electrically conductive material used to facilitate heat conduction to an external cooling source, where heat conduction can be many times better than the heat conduction of the superconducting material. Common metals with high electrical and thermal conductivity are also inexpensive compared to most superconducting materials. Using conductive metals, as described herein, for the majority of part-cavity pieces may reduce cost, by replacing expensive material required for the cavity structure to be formed from a bulk superconductor, such as niobium metal.

It will be appreciated that variations of the above-disclosed and other features and functions, or alternatives thereof, may be desirably combined into many other different systems or applications. In certain embodiments, accelerating cavities with longitudinal seams are formed from, or coated with, a superconducting material. In some embodiments, such cavities are formed from copper, aluminum, tin, or copper alloys (including bronze) which serve as the electrically conductive material. Longitudinal seams can be used to seal longitudinally divided copper (or other such material) cavities that incorporate niobium metal as the superconductor. In other embodiments, longitudinal seams seal longitudinal copper cavities that incorporate $Nb_3Sn$ as the superconductor by direct application. In still other embodiments, longitudinal seams seal longitudinal copper cavities that incorporate bronze, niobium, and/or tin layers to produce $Nb_3Sn$ as the superconductor coating after reaction.

In certain embodiments, the cavities as described above comprise selected chambers (cells) that contain the superconductor. This can include hybrid mixed superconductor associated with normal metal cavities; traveling-wave cavities; and drift cavities with side chambers.

In other embodiments, cavities as described above can include other coatings that are applied to the superconductor. Such coatings can modify the secondary electron emission properties of the cavity; can modify the work function or multipactoring behavior; and can include dielectric coatings.

In certain embodiments, patterning or lithographic techniques can be applied to the superconductors in the cavities described above to tailor electric field configuration within the cavity.

Based on the foregoing, it can be appreciated that a number of embodiments, preferred and alternative, are disclosed herein. For example, in one embodiment, a method for fabricating accelerator cavities comprises forming at least two pieces of an RF resonating cavity and joining the at least two pieces of the RF resonating cavity with a longitudinal seal thereby forming an RF resonating cavity. In an embodiment, the at least two pieces of the RF resonating cavity comprise at least one of aluminum, copper, tin, and copper alloys.

In an embodiment, the method further comprises coating the at least two pieces of the RF resonating cavity. The coating can comprise a superconductor. The superconductor comprises one of niobium, MgB2, and Nb3Sn.

In an embodiment, the method further comprises heat treating the RF resonating cavity. Heat treating the RF resonating cavity further comprises heating the RF resonating cavity to a temperature ranging from 600° C. to 1100° C.

In another embodiment, the method further comprises applying one of patterning and lithographic processes to surfaces of the RF resonating cavity to tailor an electric field configuration therein.

In another embodiment, a system comprises at least two pieces of an RF resonating cavity and a longitudinal seal joining the at least two pieces of the RF resonating cavity thereby forming an RF resonating cavity. In an embodiment of the system, the at least two pieces of the RF resonating cavity comprise at least one of aluminum, copper, tin, and copper alloys.

In an embodiment the system further comprises a coating applied to the at least two pieces of the RF resonating cavity. The coating can comprise a superconductor. The superconductor can comprise one of niobium, MgB2, and Nb3Sn.

In another embodiment of the system, a heat treatment cycle is applied to the RF resonating cavity. The heat treatment cycle further comprises heating the RF resonating cavity to a temperature ranging from 600° C. to 1100° C.

In another embodiment of the system, a pattern formed in at least one surface of the RF resonating cavity can be applied via one of patterning and lithographic processes and is configured to tailor an electric field configuration therein.

In yet another embodiment, a method for fabricating accelerator cavities comprises forming at least two pieces of an RF resonating cavity, applying a superconducting coating to at least one surface of the at least two pieces of the RF resonating cavity, and joining the at least two pieces of the RF resonating cavity with a longitudinal seal thereby forming an RF resonating cavity.

In an embodiment, the at least two pieces of the RF resonating cavity comprise at least one of aluminum, copper, tin, and copper alloys.

In an embodiment, the superconductor comprises one of niobium, MgB2, and Nb3Sn.

An embodiment of the method further comprises heat treating the RF resonating cavity, wherein heat treating the RF resonating cavity further comprises heating the RF resonating cavity to a temperature ranging from 600° C. to 1100° C.

It will be appreciated that variations of the above-disclosed and other features and functions, or alternatives thereof, may be desirably combined into many other different systems or applications. Also it will be appreciated that various presently unforeseen or unanticipated alternatives, modifications, variations or improvements therein may be subsequently made by those skilled in the art which are also intended to be encompassed by the following claims.

What is claimed is:

1. A method for fabricating accelerator cavities comprising:
   forming two half cavity pieces of an RF resonating cavity; and
   joining said two half cavity pieces of said RF resonating cavity with a single longitudinal seam, such that the longitudinal seam intersects a cavity opening at a perpendicular angle, thereby forming an RF resonating cavity, wherein during operation of the RF resonating cavity an induced RF current does not cross the longitudinal seam.

2. The method of claim 1 wherein said two half cavity pieces of said RF resonating cavity comprise at least one of:
   aluminum;
   copper;
   tin; and
   copper alloys.

3. The method of claim 1 further comprising:
   spraying a coating on said two half cavity pieces of said RF resonating cavity.

4. The method of claim 3 wherein said coating comprises a superconductor.

5. The method of claim 4 wherein said superconductor comprises one of:
   niobium;
   MgB2; and
   Nb3Sn.

6. The method of claim 1 further comprising heat treating said RF resonating cavity after joining said two half cavity pieces of said RF resonating cavity with a longitudinal seam thereby forming an RF resonating cavity.

7. The method of claim 6 wherein heat treating said RF resonating cavity further comprises:
   heating said RF resonating cavity to a temperature ranging from 600° C. to 1100° C.

8. The method of claim 1 wherein joining said two half cavity pieces of said RF resonating cavity with a single longitudinal seam thereby forming an RF resonating cavity further comprises:
   applying a brazing agent to the two half cavity pieces where they will be joined; and
   brazing the two half cavity pieces together forming the single longitudinal seam.

9. A method for fabricating accelerator cavities comprising:
   forming two half cavity pieces of an RF resonating cavity;
   applying a superconducting coating to at least one surface of said two half cavity pieces of said RF resonating cavity via one of vacuum plasma spray, physical vapor deposition, sputtering, ion-beam deposition, evaporation, and laser ablation;
   joining said two half cavity pieces of said RF resonating cavity with a longitudinal seal such that the longitudinal seal intersects a cavity opening at a perpendicular angle, thereby forming an RF resonating cavity, wherein during operation of the RF resonating cavity an induced RF current does not cross the longitudinal seam; and
   heat treating said RF resonating cavity wherein heat treating said RF resonating cavity further comprises heating said RF resonating cavity to a temperature ranging from 600° C. to 1100° C.

10. The method of claim 9 wherein said two half cavity pieces of said RF resonating cavity comprise at least one of:
    aluminum;
    copper;
    tin; and
    copper alloys.

11. The method of claim 9 wherein said superconductor comprises one of:
    niobium;
    MgB2; and
    Nb3Sn.

* * * * *